(12) United States Patent
Rovedo et al.

(10) Patent No.: US 6,352,903 B1
(45) Date of Patent: Mar. 5, 2002

(54) JUNCTION ISOLATION

(75) Inventors: Nivo Rovedo, LaGrangeville; David B. Colavito, Rock Hill, both of NY (US)

(73) Assignee: International Business Machines Corporation, Armonk, NY (US)

( * ) Notice: Subject to any disclaimer, the term of this patent is extended or adjusted under 35 U.S.C. 154(b) by 56 days.

(21) Appl. No.: 09/605,730

(22) Filed: Jun. 28, 2000

(51) Int. Cl.[7] ................................................ H01L 21/20
(52) U.S. Cl. ..................... 438/387; 438/240; 438/396
(58) Field of Search ................... 257/382, 384, 257/412, 413, 388, 377; 438/424, 255, 253, 595, 242, 239, 254, 240, 387, 396, 256

(56) References Cited

U.S. PATENT DOCUMENTS

| | | | | |
|---|---|---|---|---|
| 5,316,982 A | * | 5/1994 | Matsuo et al. | |
| 5,976,928 A | * | 11/1999 | Kirin et al. | 428/240 |
| 6,030,867 A | * | 2/2000 | Chien et al. | 438/255 |
| 6,184,078 B1 | * | 2/2001 | Yoon et al. | 438/253 |
| 6,200,854 B1 | * | 4/2001 | Chuang | 438/253 |
| 6,235,575 B1 | * | 5/2001 | Kasai et al. | 438/242 |

FOREIGN PATENT DOCUMENTS

JP    2000195967 A  *  7/2000  ....... H01L/21/8234

* cited by examiner

*Primary Examiner*—Matthew Smith
*Assistant Examiner*—V. Yevsikov
(74) *Attorney, Agent, or Firm*—Eric W. Petraske

(57) ABSTRACT

In a bulk silicon process, an insulating layer is placed under the portion of the source and drain used for contacts, thereby reducing junction capacitance. The processing involves a smaller than usual transistor area that is not large enough to hold the contacts, which are placed in an aperture cut into the shallow trench isolation.

6 Claims, 2 Drawing Sheets

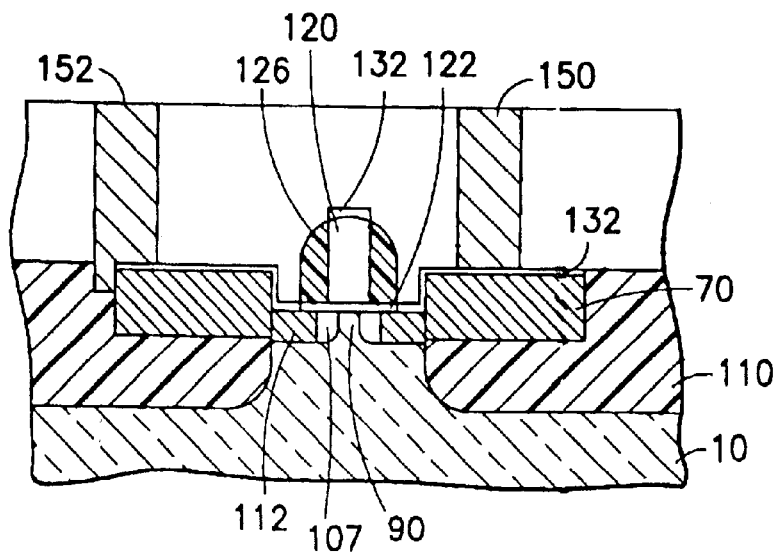
FIG. 1
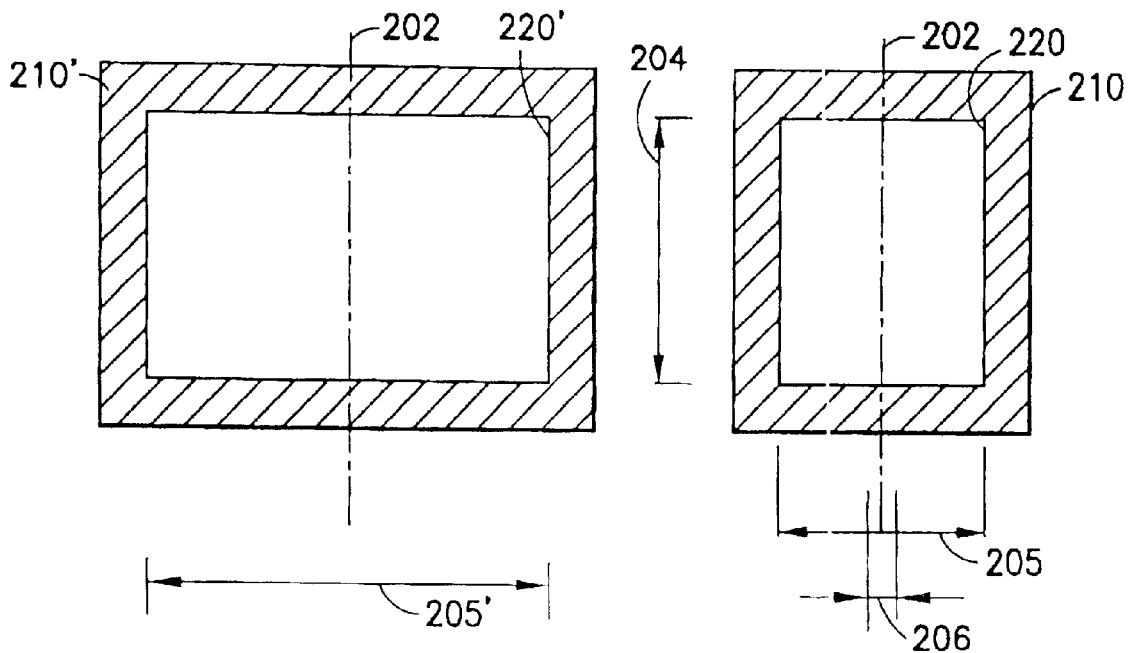
FIG. 2A
PRIOR ART
FIG. 2B

JUNCTION ISOLATION

FIELD OF THE INVENTION

The field of the invention is integrated circuit processing, in particular low-capacitance high speed circuits.

BACKGROUND OF THE INVENTION

It is well known in the field that junction capacitance between sources and drains (S/D) and the substrate is an important limiting factor in circuit performance. In addition, S/D to substrate leakage results in useless power consumption. Furthermore, contacts to SID diffusions may suffer form reliability concerns if the etch of the contacts places the conductive material of the contact in close proximity to the bottom junction edge through overetch or misalignment.

Silicon on insulator technology has less junction capacitance than bulk technology because the buried insulator reduces the capacitance, but is more expensive.

It is desirable to develop a low-capacitance transistor structure with low SID leakage for bulk silicon integrated circuits that is economical to manufacture.

SUMMARY OF THE INVENTION

A feature of the invention is the formation of conductive contact pads over a portion of the STI to reduce the area, reduce capacitance and leakage between the source/drain and the silicon substrate.

Another feature of the invention is a reduced size of the transistor area within the shallow trench isolation (STI) that is less than would have been required to provide space for contacts to the rest of the circuit if these contacts were fully within the active region.

BRIEF DESCRIPTION OF THE DRAWINGS

FIG. 1 shows in cross section a completed transistor constructed according to the invention.

FIG. 2A shows a top view of a prior art transistor area.

FIG. 2B shows a top view of a transistor area according to the invention.

DESCRIPTION OF THE PREFERRED EMBODIMENT

Figure 3:
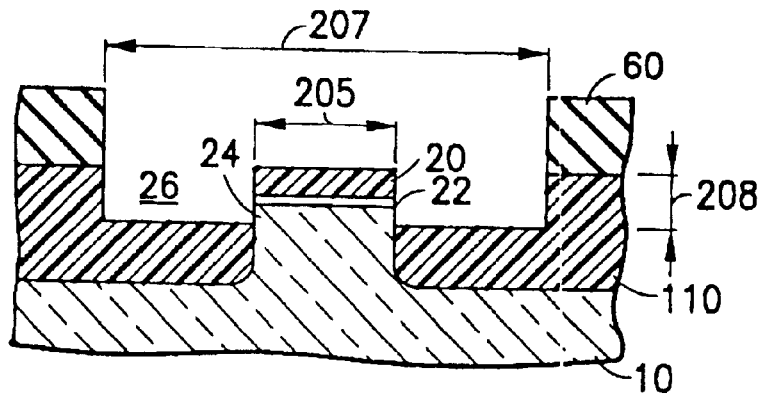
FIGS. 3–5 show in cross section various steps in practicing the invention.

FIG. 2A shows a top view of a prior art transistor area after the step of forming the shallow trench isolation 210' (STI), in which area 220' which will hold the transistor gate (centered on axis 202), source and drain, is defined by trench 210', illustratively formed in a conventional etching process, filled with oxide and planarized in a chemical-mechanical polishing step (CMP). FIG. 2B shows a corresponding view of area 220 according to the invention bounded by STI 210. Note that the length. 204 along the gate is the same but that area 220 is much smaller than area 220' in the prior art. As will be described later, the area for the sources and drains is reduced below what is required for contacts to fit. The phrase "reduced source and drain areas" will be used in the claims to mean that the source and drain in the single-crystal substrate are too small to receive contacts in the ground rules in use in that particular process. Arrow 206 denotes the width of the gate to be formed and arrow 205 denotes the width of the gate sidewalls plus a small margin for manufacturing tolerance. Illustratively, in a 0.18 μm ground rule CMOS process, gate width 206 is 0.18 μm and width 205 is 0.49 μm. Contacts illustratively require a contact area of 0.46 μm×0.46 μm including manufacturing tolerance, so total active area width 205' would be 1.1 μm, compared to about 1 μm in the contact pads.

Referring now to FIG. 3, there is shown in cross section the portion of the circuit that will hold an illustrative transistor. Substrate 10 has been prepared by forming a conventional pad oxide ($SiO_2$) 22 and pad etch stop layer 20, illustratively nitride ($Si_3N_4$). STI member 110 has been etched in a conventional process using $C_4F_8$ chemistry chemistry selective to nitride to form recess 26 having a contact pad depth denoted by arrow 208. Resist 60 has been patterned with a noncritical contact etch aperture having a width denoted by arrow 207. The contact recess apertures 26 define contact portions of the STI member 110 that will contain contact pads for interconnects to make contact with the source and drain. If the ground rules would be violated by placing contacts on the STI, then appropriate corrections will be made, such as increasing the width of the STI or spacing adjacent elements further away. The contact pad depth of aperture 26 is such that the vertical contact surface 24 that will be the electrical contact between the source/drain and the contact pads is sufficiently large. Illustratively the depth of the recess is 0.2 μm and the vertical contact surface is 0.08 μm high.

Figure 4:
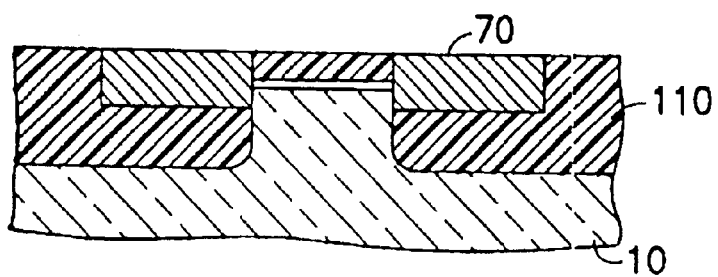

Referring now to FIG. 4, there is shown the same area after the deposition of conductive material 70 and CMP using the pad nitride 20 and STI 110 as a polish stop. Illustratively, the conductive material is polycrystalline silicon or amorphous silicon.

Figure 5:
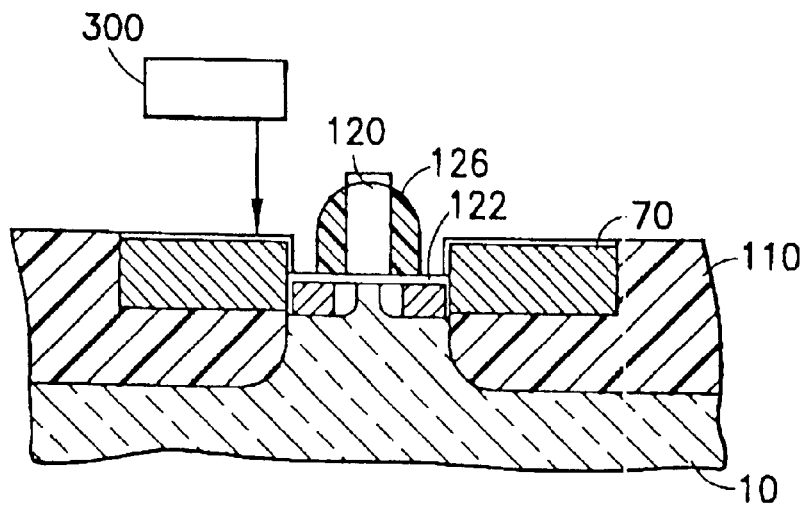

Next, as shown in FIG. 5, pad nitride 20 is stripped, wells are formed, pad oxide 22 is stripped, gate oxide 122 is grown, gate stack 120 is formed and patterned, the low dose implant is performed in the source/drain areas 122, gate sidewalls 126 are formed, the source/drain and contact pads are implanted, and an activation anneal is performed. The circuit is completed by forming conventional interconnection members and interlayer dielectrics, denoted schematically by a box labeled 300.

FIG. 1 shows the final structure, in which contact pads 70 bracket the transistor, comprising gate 120 and gate oxide 122, with sidewalls 126 and gate silicide 132. Silicide 132 is also formed on top of contact pads 70. Beneath the gate, source/drain 112 is implanted at the same time as the contact pads. As can be seen, the portion of the S/D members extending outwardly past the sidewalls is only a manufacturing tolerance and not enough to hold a contact. S/D members of this size will be referred to in the claims as "reduced S/D members". A conventional lower dose source/drain extension has been formed. Contact interconnect members 150 and 152 are shown. Contact 152 illustrates an advantageous feature of the invention—if the contact is misaligned so that it partly lands on the STI, no harm is done. The contact etch will merely penetrate into the STI, with additional contact area being formed on the vertical wall of the contact pad. Note that contact pad members 70 can be extended over an STI member to form a local interconnect between the diffusions on either side of that STI member.

While the invention has been described in terms of a single preferred embodiment, those skilled in the art will recognize that the invention can be practiced in various versions within the spirit and scope of the following claims. By way of example, the substrate may be silicon or silicon-germanium; the gate dielectric may be thermal oxide or a high-k material such as $N_2O_3$ or silicon nitride; the planarizing step may be performed by etching instead of CMP; the conductive material may be polycrystalline silicon, amorphous silicon, SiGe, etc. The substrate is not necessarily bulk silicon. The invention may be performed in SiGe, or in an SOI substrate if the thickness of the silicon device layer is thick enough to give rise to significant capacitance, or if the thickness of the insulating layer is thin enough to give rise to significant capacitance.

We claim:

1. A method of forming an integrated circuit in a semiconductor substrate comprising the steps of:

preparing said substrate, including forming a pad etch stop layer;

forming a set of STI members defining a set of transistor areas covered by said pad etch stop, said transistor areas having reduced source and drain areas;

defining a set of contact etch apertures in a resist area, said contact etch apertures covering said transistor areas and extending over a contact portion of said STI members on opposite sides of said transistor areas;

etching said contact portion of said STI members to a contact pad depth in a contact pad aperture, thereby exposing vertical contact surfaces in said substrate on said opposite sides of said transistor region;

depositing a layer of conductive material, thereby forming contact pads in said contact pad apertures, said contact pads being in electrical contact with said vertical contact surfaces;

forming transistors in said transistor areas, said transistors having sources and drains contacting said contact pads through said vertical contact surfaces; and forming a set of interconnection members to complete said integrated circuit, at least some of said interconnection members contacting said contact pads.

2. A method according to claim 1, in which said reduced source and drain areas have dimensions less than are required to hold contacts.

3. A method according to claim 2, in which said step of etching said contact portion of said STI members is performed with an etchant selective to said etch stop layer, whereby said etch stop layer protects said transistor area thereunder.

4. A method according to claim 2, in which said pad etch stop layer is formed from nitride, said STI members are formed from oxide and said conductive material is silicon.

5. A method according to claim 1, in which said step of etching said contact portion of said STI members is performed with an etchant selective to said etch stop layer, whereby said etch stop layer protects said transistor area thereunder.

6. A method according to claim 5, in which said pad etch stop layer is formed from nitride, said STI members are formed from oxide and said conductive material is silicon.

* * * * *